(12) United States Patent
Hirata

(10) Patent No.: US 6,830,429 B2
(45) Date of Patent: Dec. 14, 2004

(54) SMALL COOLING FAN

(75) Inventor: Masahiko Hirata, Oita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 97 days.

(21) Appl. No.: 10/224,425

(22) Filed: Aug. 21, 2002

(65) Prior Publication Data

US 2003/0039545 A1 Feb. 27, 2003

(30) Foreign Application Priority Data

Aug. 27, 2001 (JP) ........................................ 2001-255697

(51) Int. Cl.[7] .............................................. F04D 29/44

(52) U.S. Cl. ..................... 415/206; 415/207; 415/224.5

(58) Field of Search ................................. 415/119, 204, 415/206, 207, 208.1, 211.2, 220, 224, 224.5

(56) References Cited

U.S. PATENT DOCUMENTS

| 847,585 | A | * | 3/1907 | Keith | ........................ 415/212.1 |
| 3,647,323 | A | * | 3/1972 | Thomas | ........................ 415/206 |
| 4,448,573 | A | * | 5/1984 | Franz | ........................ 415/212.1 |
| 6,599,090 | B2 | * | 7/2003 | Ozaki et al. | ................. 415/206 |
| 6,637,501 | B2 | * | 10/2003 | Lin et al. | .................... 165/80.3 |

* cited by examiner

Primary Examiner—Edward K. Look
Assistant Examiner—Richard A. Edgar
(74) Attorney, Agent, or Firm—Wenderoth, Lind & Ponack, L.L.P.

(57) ABSTRACT

A small cooling fan includes a rotating fan body with a vane in a flat fan housing, and an air channel for backflow prevention. The air channel is provided outside of the vicinity of the tip of the vane of the rotating fan body, extends to an air outlet, and has an inner height larger than that of a fan chamber. This structure can prevent the backflow of the wind at the air outlet and reduce the loss of the static pressure, thereby increasing the airflow quantity in spite of the small size.

12 Claims, 10 Drawing Sheets

○ 5V:4,800r/min 4.3C.F.M/109Pa 39.5dBA at 60°C
□ 4V:4,100r/min 3.6C.F.M/74Pa 35.0dBA at 60°C
× 3V:3,200r/min 2.8C.F.M/42Pa 28.0dBA at 60°C ○ 5V:4,900r/min 4.0C.F.M/109Pa 40.5dBA at 60°C
□ 4V:4,100r/min 3.3C.F.M/73Pa 35.0dBA at 60°C
✕ 3V:3,200r/min 2.6C.F.M/41Pa 28.0dBA at 60°C

FIG. 8

<Shape>
□60mm×53mm Thickness :12mm
Height of air channel : 2mm, Height of fan chamber : 11mm Input voltage: 5V

| | Maximum flow quantity(C.F.M) | Maximum static Pressure(Pa) | Number of revolutions (r/min) | Noise (dBA) |
|---|---|---|---|---|
| Test data1 with air channel | 4.3 | 109 | 4,800 | 39.5 |
| Test data2 without air channel | 4.0 | 109 | 4,900 | 40.5 |

Input voltage: 4V

| | Maximum flow quantity(C.F.M) | Maximum static Pressure(Pa) | Number of revolutions (r/min) | Noise (dBA) |
|---|---|---|---|---|
| Test data1 with air channel | 3.6 | 74 | 4,100 | 35.0 |
| Test data2 without air channel | 3.3 | 73 | 4,100 | 35.0 |

Input voltage: 3V

| | Maximum flow quantity(C.F.M) | Maximum static Pressure(Pa) | Number of revolutions (r/min) | Noise (dBA) |
|---|---|---|---|---|
| Test data1 with air channel | 2.8 | 42 | 3,200 | 28.0 |
| Test data2 without air channel | 2.6 | 41 | 3,200 | 28.0 |

Result :The maximum flow quantity has increased by approx.10%

SMALL COOLING FAN

FIELD OF THE INVENTION

The present invention relates to a small cooling fan used to radiate the heat from a heating component, such as a microprocessing unit (hereinafter referred to as an MPU) in a personal computer or other electronic equipment.

BACKGROUND OF THE INVENTION

Generally, an electrical apparatus, such as small electronic equipment including a multi-functional and high-performance personal computer, incorporates an MPU, as a functional part thereof. However, this MPU generates heat and is destroyed by the heat at temperatures more than approx. 90° C. Thus, the MPU is equipped with a cooling device to radiate the heat generated in the MPU and provide safety for the electronic equipment.

A desired cooling device is of a small type. However, a typical cooling module that has heat radiating fins cannot provide sufficient cooling. Therefore, a cooling device has been proposed that has a small cooling fan as a main constituent component and is formed as a cooling module, as shown in a partially cutaway perspective view of a conventional cooling module in FIG. 4 and a plan view thereof in FIG. 5.

This cooling device is structured as a so-called cooling module. A heat receiving section 5 having a heating component 4, e.g. an MPU, joined thereto is joined to a flat cooling fan 3. The cooling fan has a housing 1 made of a die casting using heat-conductive aluminum, and a rotating fan 2 housed therein. A heat radiating section 6 having heat radiating fins is joined to the air outlet side of cooling fan 3. The cooling device has a heat sink effect as a cooling module. Moreover, the wind generated by the rotation of rotating fan 2 forcedly cools the fins in heat radiating section 6 to which the heat of heating component 4 has been transferred. Thereby, heating component 4 radiates heat and cools down.

Now, in a recent notebook personal computer, the operation of the MPU and other components at high frequencies is necessitated by image processing and other purposes, thus involving heat generation at high temperatures. It is difficult to cool the heating components with the above-mentioned cooling device sufficiently. Especially in the cooling fan, backflow of the wind is likely to occur at the air outlet of the housing. Thus, such a loss of airflow quantity and static pressure hinders sufficient cooling of the fins in the heat radiating section. Therefore, the cooling fan cannot drastically lower the temperatures of heating components, e.g. an MPU, which process data at high frequencies for image processing. In addition, there is another problem. Sufficient cooling requires a large cooling fan. It is difficult to use a large cooling fan as a cooling device for a notebook personal computer.

SUMMARY OF THE INVENTION

The present invention provides a small cooling fan comprising:
- a rotating (rotary) fan body with a vane that is provided in a fan housing;
- an air outlet provided on one side of the fan housing; and
- an air channel for backflow prevention provided outside of the vicinity of the tip of the vane of the rotating fan body and extending to the air outlet.

BRIEF DESCRIPTION OF THE DRAWINGS

FIG. 8 is data for confirming an effect of an air channel.

PREFERRED EMBODIMENTS OF THE INVENTION

Exemplary embodiments of the present invention are demonstrated hereinafter with reference to the accompanying drawings.

(First Exemplary Embodiment)

Figure 1:
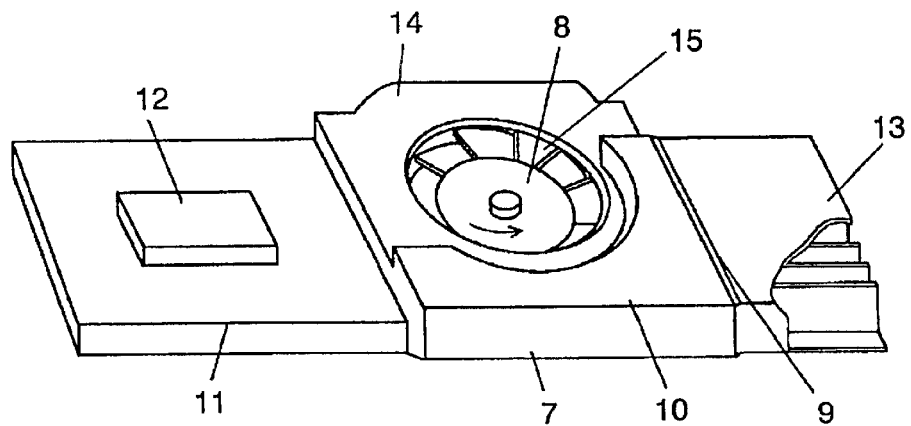
FIG. 1 is a perspective view of a small cooling fan in accordance with a first exemplary embodiment of the present invention.
Figure 2:
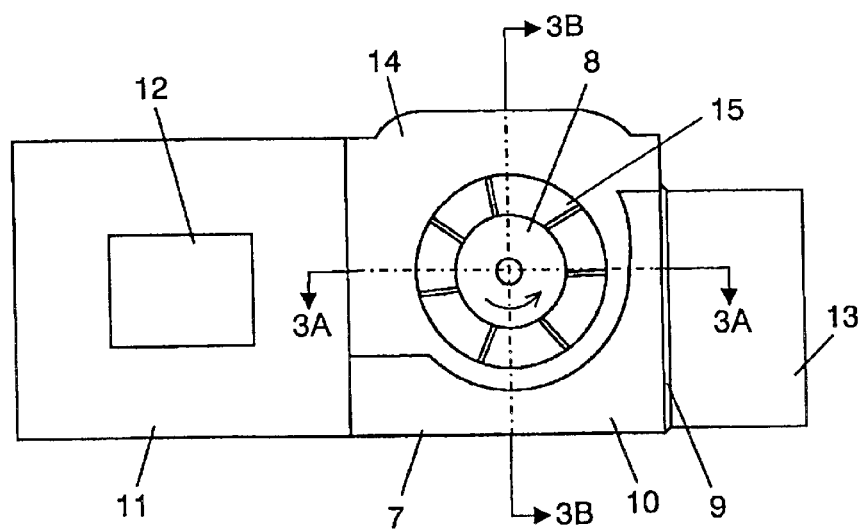
FIG. 2 is a plan view of the small cooling fan in accordance with the first exemplary embodiment of the present invention.
Figure 3A:
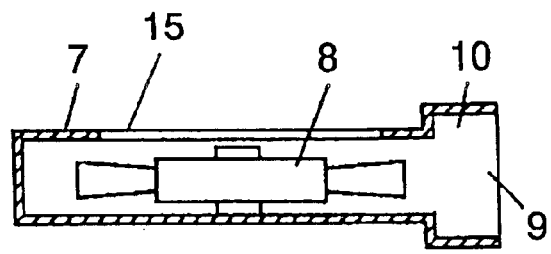
FIG. 3A is a sectional view of FIG. 2 taken along line 3A—3A.
Figure 3B:
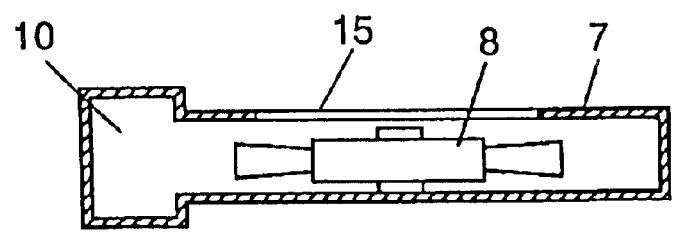
FIG. 3B is a sectional view of FIG. 2 taken along line 3B—3B.
Figure 4:
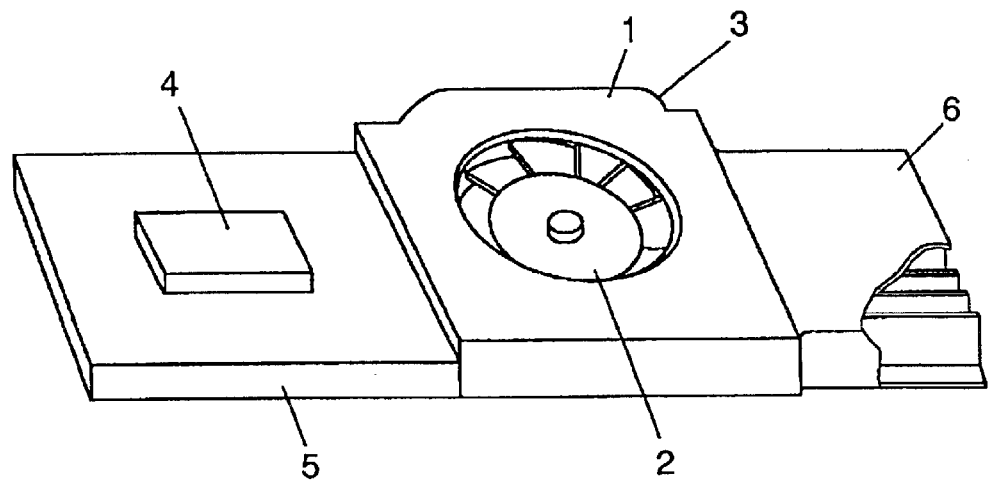
FIG. 4 is a partially cutaway perspective view of a conventional cooling module.
Figure 5:
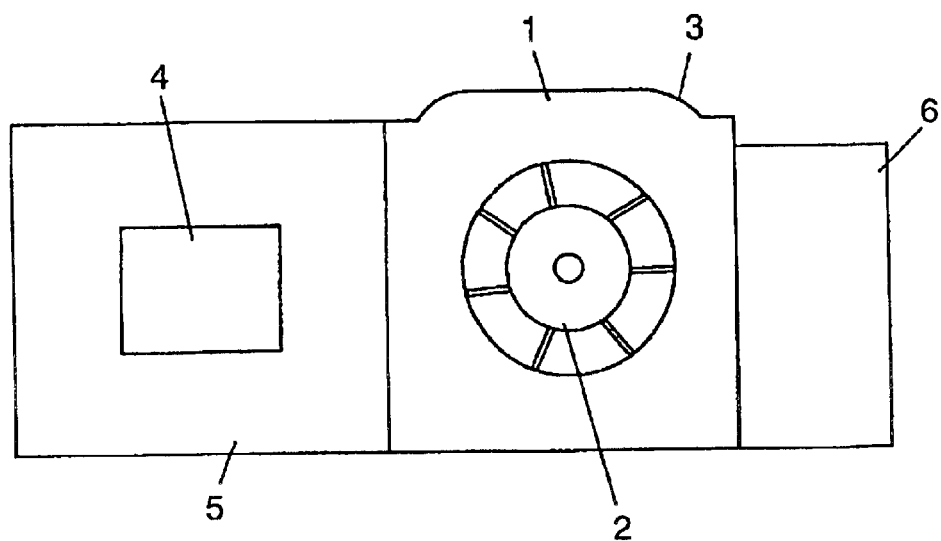
FIG. 5 is a plan of the conventional cooling module.

FIG. 1 is a perspective view of a small cooling fan in accordance with the first exemplary embodiment of the present invention. FIG. 2 is a plan view thereof. FIG. 3A is a sectional view of FIG. 2 taken along line 3A—3A. FIG. 3B is a sectional view of FIG. 2 taken along line 3B—3B.

The cooling fan of the first embodiment as shown in FIG. 1 is a cooling module including a heat receiving section 11, a fan housing 7 including a fan chamber 14 and an air channel 10, and heat radiating fins 13 connected to an air outlet 9 of fan housing 7.

Heat receiving section 11 has a heating component 12, e.g. a microprocessing unit (hereinafter referred to as an MPU), joined thereto. The heat receiving section is for efficiently absorbing heat generated by heating component 12 and allowing heat transfer from fan housing 7 to heat radiating fins 13. Fan housing 7 is formed of a plastic molding material, a heat transfer material, e.g. a die casting using highly heat-conductive aluminum, or other materials, as a substantially square or circular flat housing. The square may have an arc in part thereof.

Fan chamber 14 has an air inlet 15 on a top surface and/or a bottom surface thereof and houses a rotating (rotary) fan body 8 and a driver thereof. In addition, fan chamber 14 is structured to form a duct of air. Rotating fan body 8 sucks air from air inlet 15 disposed on the top surface of fan chamber 14 and blows the air toward air outlet 9. The air inlet has an outer diameter smaller than that of the fan (50 to 90% of the outer diameter of the fan). Heat radiating fins 13 are coupled to the air exhaust side of air outlet 9 of air channel 10 formed in fan housing 7. The heat radiating fins are provided to more efficiently radiate the heat transferred from heat receiving section 11.

Fan housing 7 has an air channel 10 for backflow prevention that is formed outside of the vicinity of the tip of the vane of rotating fan body 8 and extends to air outlet 9. Between fan chamber 14 and air channel 10, a step is formed by the difference in inner height therebetween. This step is formed between the outer peripheral edge of air inlet 15 and the outer periphery of fan housing 7. A part of the step is disposed in the vicinity of the tip of rotating fan body 8. At least a part of air channel 10 for backflow prevention is connected to air outlet 9 that is coupled to heat radiating fins 13. The air channel is also disposed on the air outlet side of rotating fan body 8 and outside of the upstream side thereof continuously along 20 to 70% of the entire outer peripheral length of the fan housing in a substantially L-shaped or U-shaped form.

As shown in FIG. 3A or FIG. 3B, air channel 10 is formed to have an inner height 10 to 100% larger than that of fan chamber 14 that constitutes a part of fan housing 7 between the open edge of air inlet 15 and the outer periphery of fan housing 7.

When the percentage of the outer peripheral length of continuous air channel 10 with respect to the entire outer peripheral length of fan housing 7 is not more than 20%, or the increment of the inner height of air channel 10 with respect to that of fan chamber 14 is not more than 10%, a duct of the air blown from the side of fan chamber 14 toward air outlet 9 by rotating fan body 8 is not sufficiently ensured. Therefore, the backflow prevention cannot provide an airflow increasing effect.

When the percentage of the outer peripheral length of continuous air channel 10 with respect to the entire outer peripheral length of fan housing 7 is at least 70%, the total quantity of the air blown from the side of fan chamber 14 toward air outlet 9 by rotating fan body 8 increases. This causes backflow and thus reduces the airflow increasing effect.

When the increment of the inner height of air channel 10 with respect to that of fan chamber 14 is at least 100%, air retention or vortex flow occurs in the air channel. This phenomenon hinders formation of a smooth airflow channel and the airflow increasing effect. Moreover, such a large air channel is not suitable for downsizing.

In the cooling fan of the first embodiment, which is constructed as a cooling module in such a manner, the heat generated by heating component 12 is transferred to heat radiating fins 13 via fan housing 7. Heat radiating fins 13 are forcedly cooled by rotating fan body 8. Thus, effective heat exchange can be provided.

Therefore, even with a heating component, e.g. an MPU, which generates high-temperature heat because it operates at high frequencies for image processing or other purposes, the temperatures can be reduced to prevent destruction caused by the heat.

Fan housing 7 has air channel 10 for backflow prevention that is formed outside of the vicinity of the tip of the vane of rotating fan body 8 and extends to air outlet 9. In addition, air channel 10 has an inner height larger than that of the fan chamber. Thus, air channel 10 for backflow prevention ensures the air duct of the fan and helps the wind from the fan to blow out because the air channel has drastically enlarged space. This structure prevents the backflow of the wind from air outlet 9 to the fan. As a result, the loss of the airflow quantity and static pressure in the fan is reduced. Moreover, configuring air channel 10 for backflow prevention in a substantially L-shaped form along the outside of rotating fan body 8 can improve the airflow quantity-static pressure characteristics by approx. 10%.

Figure 6:
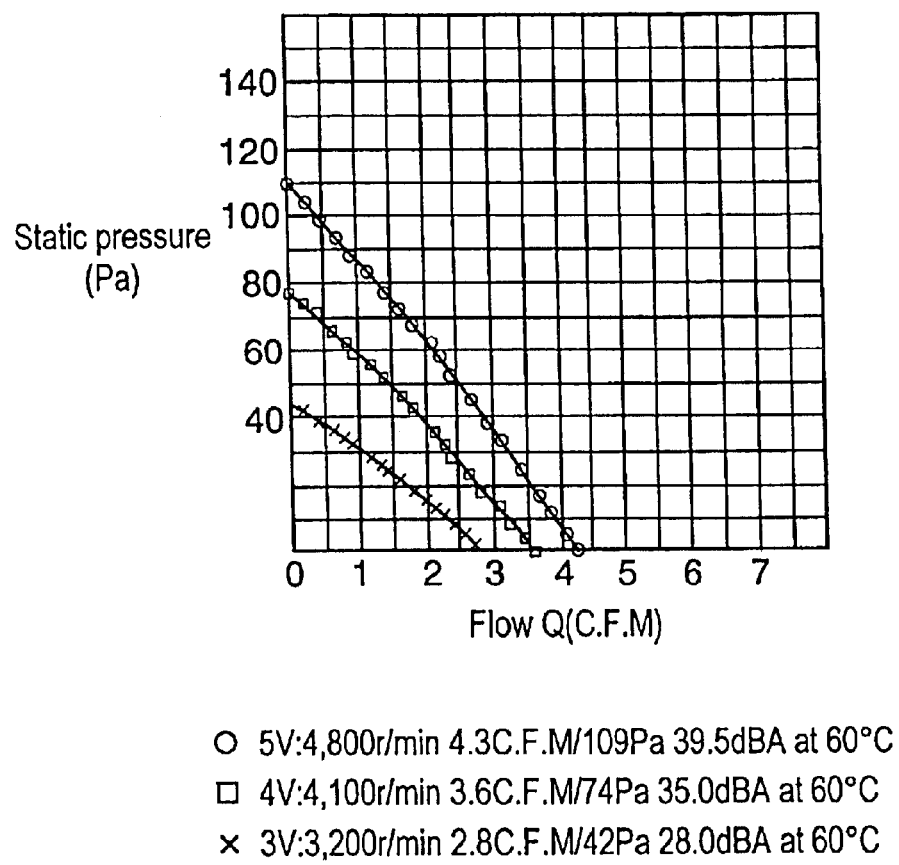
FIG. 6 shows airflow quantity-static pressure characteristics of a cooling module of the present invention that has an air channel having an inner height 18% larger than that of a fan chamber of a fan housing.
Figure 7:
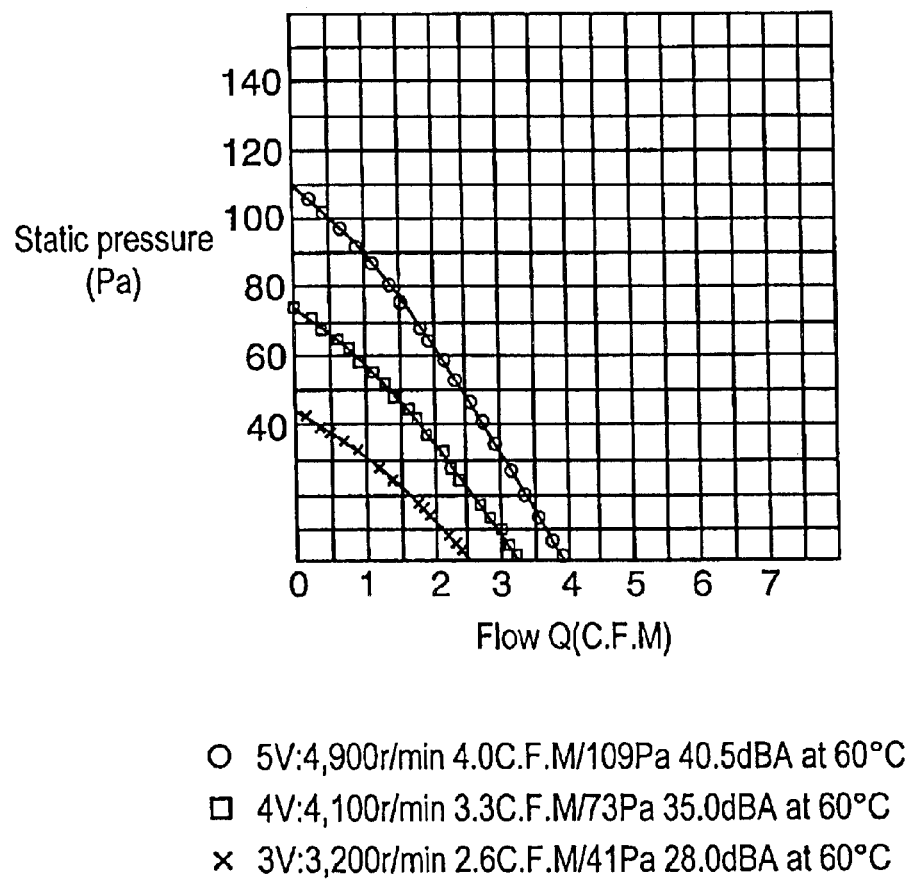
FIG. 7 shows airflow quantity-static pressure characteristics of the conventional cooling module.

FIG. 7 shows airflow quantity-static pressure characteristics of a conventional cooling fan without an air channel. FIG. 6 shows airflow quantity-static pressure characteristics of a cooling fan of the present invention that has an air channel having an inner height increased from 11mm to 13mm (approx. 18% larger than that of the fan chamber formed of fan housing 7). FIG. 8 is a table giving comparison of the maximum airflow quantity between the two cooling fans, as data for confirming the effect of the air channel. As obvious from this result, a small cooling fan with large airflow quantity that is useful for cooling a notebook personal computer, for example, can easily be realized in this manner.

In the above-mentioned modularized cooling fan, in order to transfer heat from heat receiving section 11 to heat radiating fins 13, a heat pipe can be provided therebetween. The fan can also be formed separately without being coupled to heat receiving section 11 or fins 13. The present invention is not limited to the structure shown in the drawings.

(Second Exemplary Embodiment)

Figure 9:
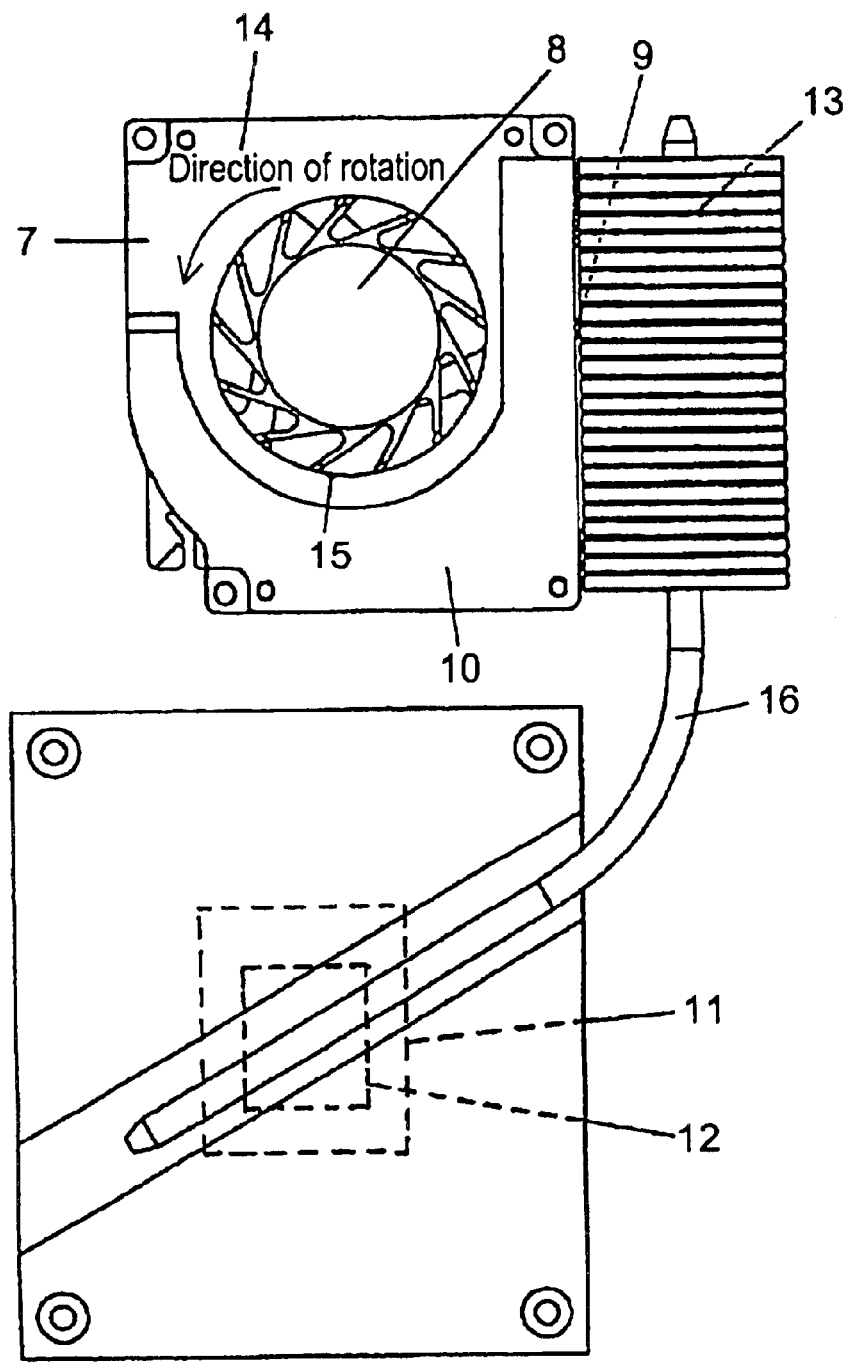
FIG. 9 is a plan view of a small cooling fan in accordance with a second exemplary embodiment of the present invention.
Figure 10:
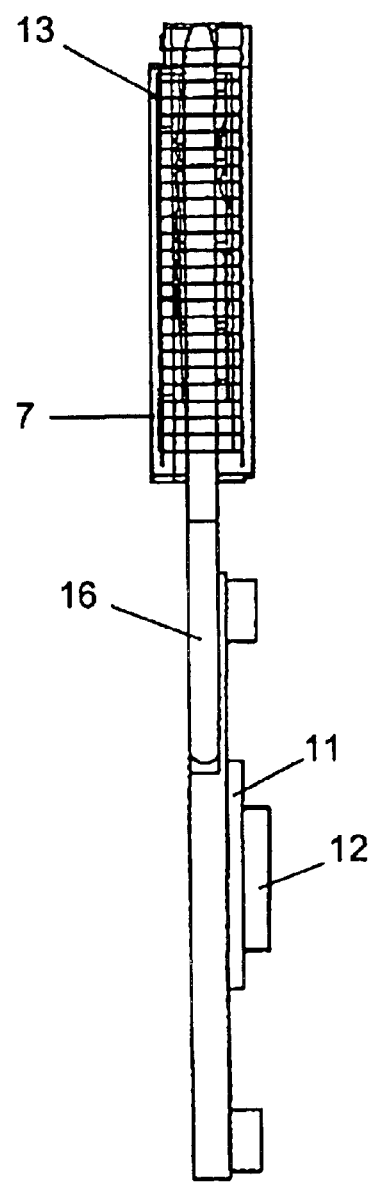
FIG. 10 is a side elevation of the small cooling fan in accordance with the second exemplary embodiment of the present invention.

A cooling fan of the second exemplary embodiment shown in FIGS. 9 and 10 is a cooling module including a heat receiving section 11, a fan housing 7, a rotating fan body 8, and heat radiating fins 13. The cooling module is structured so that heat receiving section 11 is separated from fan housing 7 but can efficiently absorb the heat generated from a heating component 12 and efficiently transfer the heat to heat radiating fins 13 using a heat pipe 16.

Heat receiving section 11 has heating component 12, e.g. an MPU, joined thereto. The heat receiving section is for efficiently absorbing the heat generated from heating component 12 and allowing heat transfer from fan housing 7 to heat radiating fins 13. Fan housing 7 is formed of a plastic molding material, a heat transfer material, e.g. a die casting using highly heat-conductive aluminum, or other materials, as a substantially square or circular flat housing. The square may have an arc in part thereof. A fan chamber 14 has an air inlet 15 on a top surface and/or a bottom surface thereof and houses rotating fan body 8 and a driver thereof. Moreover, fan chamber 14 is structured to form an air duct.

Rotating fan body 8 sucks air from air inlet 15 disposed on the top surface of fan chamber 14 and blows the air toward air outlet 9. The air inlet has an outer diameter smaller than that of the fan (50 to 90% of the outer diameter of the fan).

Heat radiating fins 13 are coupled to the air exhaust side of air outlet 9 of an air channel 10 formed in fan housing 7. The heat radiating fins are provided to more efficiently radiate the heat transferred from the heat receiving section. Fan housing 7 has air channel 10 for backflow prevention that is formed outside of the vicinity of the tip of the vane of rotating fan body 8 and extends to air outlet 9. Between fan chamber 14 and air channel 10, a step is formed by the difference in inner height therebetween.

This step is formed between the outer peripheral edge of air inlet 15 and the outer periphery of fan housing 7. A part of the step is disposed in the vicinity of the tip of rotating fan body 8. At least a part of air channel 10 for backflow prevention is connected to air outlet 9 that is coupled to heat radiating fins 13. The air channel is also disposed on the air outlet side of rotating fan body 8 and outside of the upstream side thereof continuously along 20 to 70% of the entire outer peripheral length of the fan housing in a substantially L-shaped form.

As shown in FIG. 3A or 3B, air channel 10 is formed to have an inner height 10 to 100% larger than that of fan chamber 14 that constitutes a part of fan housing 7 between the open edge of air inlet 15 and the outer periphery of the fan housing.

As a result, the loss of the airflow quantity and static pressure in the fan is reduced. In addition, configuring air channel 10 for backflow prevention in a substantially L-shaped form along the outside of rotating fan body 8 can improve the airflow quantity-static pressure characteristics by approx. 10% similar to the first embodiment.

(Third Exemplary Embodiment)

Figure 11:
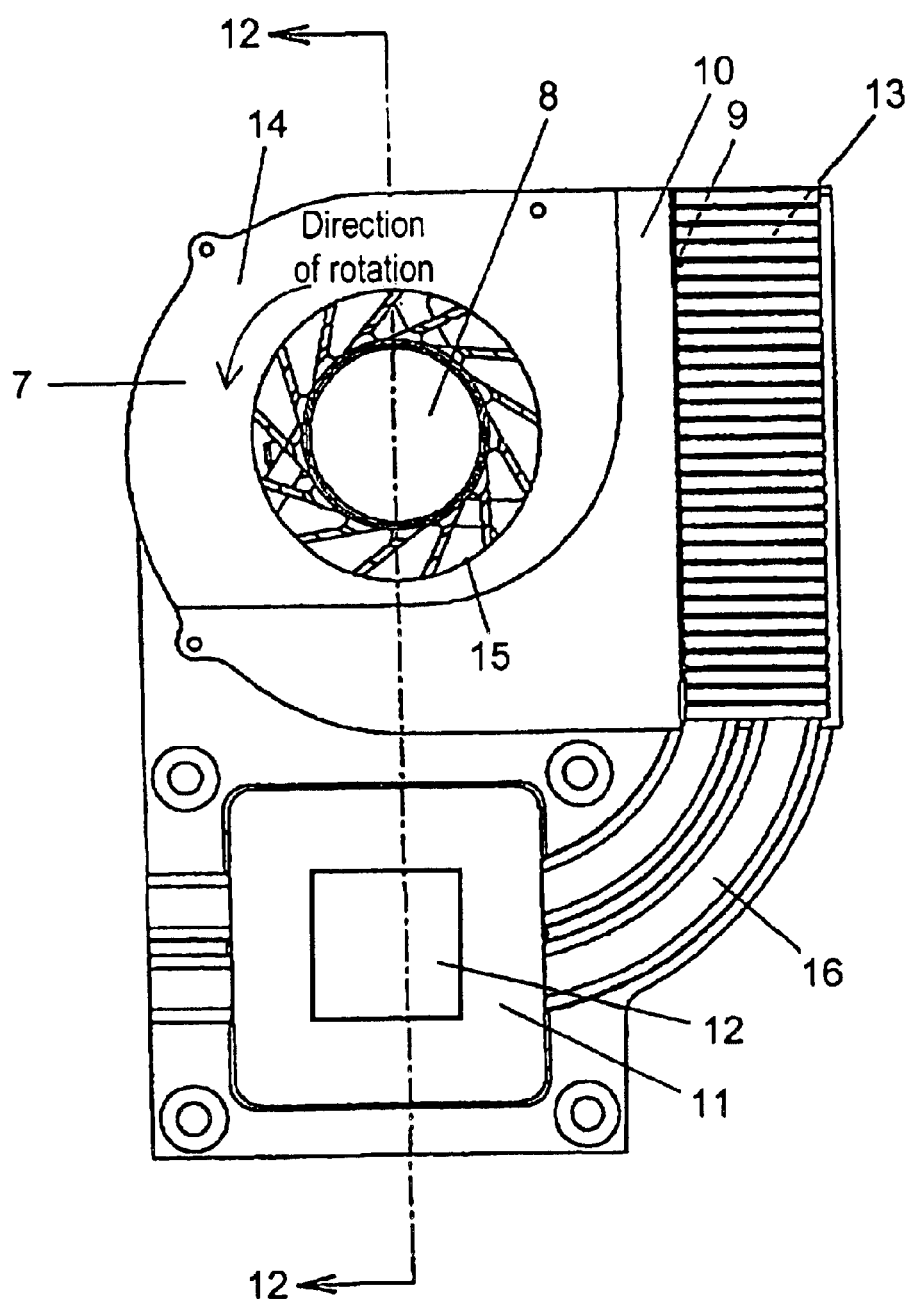
FIG. 11 is a plan view of a small cooling fan in accordance with a third exemplary embodiment of the present invention.
Figure 12:
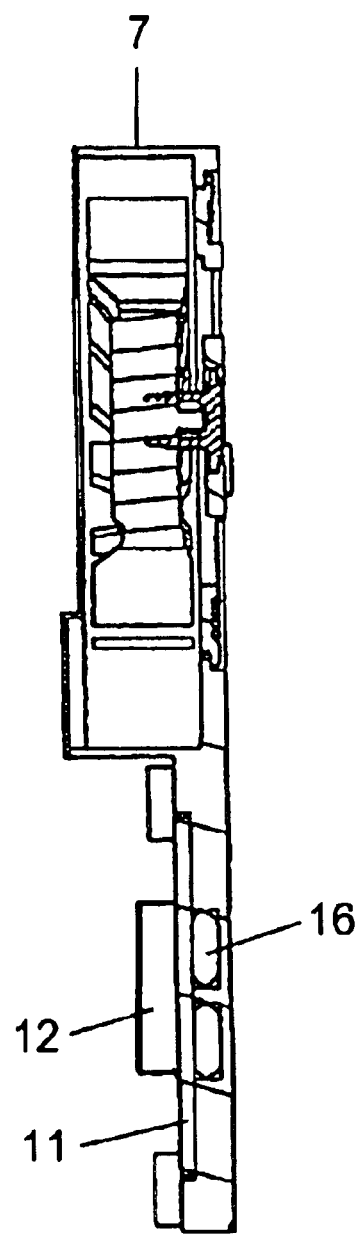
FIG. 12 is a sectional view taken along line 12—12 of the small cooling fan in accordance with the third exemplary embodiment of the present invention.

A cooling fan of the third exemplary embodiment shown in FIGS. 11 and 12 is a cooling module including a heat receiving section 11, a fan housing 7, a rotating fan body 8, and heat radiating fins 13. The cooling module is structured so that heat receiving section 11 is mounted on the same base incorporating fan housing 7 and heat radiating fins 13 and can efficiently transfer the heat generated from a heating component 12 to heat radiating fins 13 using a heat pipe 16.

Heat receiving section 11 has heating component 12, e.g. an MPU, joined thereto. The heat receiving section efficiently absorbs the heat generated from heating component 12 and allows heat transfer from fan housing 7 to heat radiating fins 13. Fan housing 7 is formed of a plastic molding material, a heat transfer material, e.g. a die casting using highly heat-conductive aluminum, or other materials, as a substantially square or circular flat housing. The square may have an arc in part thereof. A fan chamber 14 has an air inlet 15 on a top surface and/or a bottom surface thereof and houses rotating fan body 8 and a driver thereof. Moreover, fan chamber 14 is structured to form an air duct. Rotating fan body 8 is for sucking air from air inlet 15 disposed on the top surface of fan chamber 14 and blowing the air toward an air outlet 9. The air inlet has an outer diameter smaller than that of the fan (50 to 90% of the outer diameter of the fan).

Heat radiating fins 13 are coupled to the air exhaust side of air outlet 9 of air channel 10 formed in fan housing 7. The heat radiating fins are provided to more efficiently radiate the heat transferred from the heat receiving section. Fan housing 7 has an air channel 10 for backflow prevention that is formed outside of the vicinity of the tip of the vane of rotating fan body 8 and extends to air outlet 9. Between fan chamber 14 and air channel 10, a step is formed by the difference in inner height therebetween. This step is formed between the outer peripheral edge of air inlet 15 and the outer periphery of fan housing 7. A part of the step is disposed in the vicinity of the tip of rotating fan body 8. At least a part of air channel 10 for backflow prevention is connected to air outlet 9 that is coupled to heat radiating fins 13. The air channel is also disposed on the air outlet side of rotating fan body 8 and outside of the upstream side thereof continuously along 20 to 70% of the entire outer peripheral length of the fan housing in a substantially L-shaped form.

As shown in FIG. 3A or 3B, air channel 10 is formed to have an inner height 10 to 100% larger than that of fan chamber 14 that constitutes a part of fan housing 7 between the open edge of air inlet 15 and the outer periphery of the fan housing.

As a result, the loss of the airflow quantity and static pressure in the fan is reduced. In addition, configuring air channel 10 for backflow prevention in a substantially L-shaped form along the outside of rotating fan body 8 can improve the airflow quantity-static pressure characteristics by approx. 10% similar to the first embodiment.

As described above, the present invention is a small cooling fan that has a rotating fan body with a vane in a flat fan housing. The cooling fan has an air channel for backflow prevention that is formed outside of the tip of the vane of the rotating fan body, extends to the air outlet, and has an inner height larger than that of the fan chamber. This structure can realize a small cooling fan that prevents the backflow of the wind at the air outlet and minimizes the loss of the airflow quantity and static pressure.

What is claimed is:

1. A small cooling fan comprising:
   a fan housing including a fan chamber having an inner height;
   a rotary fan body having a vane, said rotary fan body being entirely disposed in said fan chamber having said inner height;
   an air outlet provided on one side of said fan housing; and
   an air channel having an inner height and extending circumferentially about said rotary fan body radially outside a tip of said vane of said rotary fan body, said air channel being fluidically connected between said rotary fan body and said air outlet for guiding air from said rotary fan body toward said outlet while preventing backflow;
   wherein said inner height of said air channel is greater than said inner height of said fan chamber such that a step is formed between said fan chamber and said air channel.

2. The small cooling fan as set forth in claim 1, wherein said fan housing is made of a heat-conductive material, and said cooling fan is a cooling module comprising a heat receiving section having a heating component and extending to an outside of said fan housing, and a heat radiating fin extending to the air outlet side.

3. The small cooling fan as set forth in claim 1, wherein said air channel is elongated in a circumferential direction about said rotary fan body; and
   said air outlet is joined with said air channel along only part of an elongated direction of said air channel.

4. The small cooling fan as set forth in claim 1, wherein said air channel is continuously formed on an air outlet side of said rotary fan body and along the outside of a side upstream of the air outlet side.

5. The small cooling fan as set forth in claim 4, wherein said fan housing is made of a heat-conductive material, and said cooling fan is a cooling module comprising a heat receiving section having a heating component and extending to an outside of said fan housing, and a heat radiating fin extending to the air outlet side.

6. The small cooling fan as set forth in claim 1, wherein a radially inner side of said air channel is curved so as to wrap circumferentially about said rotary fan body; and
   a radially outer side of said air channel is L-shaped.

7. The small cooling fan as set forth in claim 6, wherein said L-shaped outer side of said air channel has first and second legs forming the L-shaped outer side; and
   said air outlet is joined with said air channel along one of said first and second legs of said L-shaped outer side.

8. The small cooling fan as set forth in claim 1, wherein the inner height of said air channel is 10 to 100% larger than the inner height of said fan chamber.

9. The small cooling fan as set forth in claim 8, wherein said air channel is continuously formed on an air outlet side of said rotary fan body and along the outside of a side upstream of the air outlet side.

10. The small cooling fan as set forth in claim 8, wherein said fan housing is made of a heat-conductive material, and said cooling fan is a cooling module comprising a heat receiving section having a heating component and extending to an outside of said fan housing, and a heat radiating fin extending to the air outlet side.

11. A small fan comprising:

a rotary fan body with a vane, provided in a fan housing;

an air outlet provided on one side of said fan housing; and an air channel for backflow prevention provided radially outside a tip of said vane of said rotary fan body and extending to said air outlet;

wherein said air channel is continuously formed on an air outlet side of said rotating fan body and along the outside of a side upstream of the air outlet side;

wherein said fan housing is made of heat-conductive material, and said cooling fan is a cooling module comprising a heat receiving section having a heating component and extending to an outside of said fan housing, and a heat radiating fin extending to the air outlet side.

12. A small cooling fan comprising:

a fan housing;

a rotary fan body having a vane;

an air outlet provided on one side of said fan housing; and an air channel extending circumferentially about said rotary fan body radially outside a tip of said vane of said rotary fan body, said air channel being fluidically connected between said rotary fan body and said air outlet for guiding air from said rotary fan body toward said outlet while preventing air backflow;

said fan housing is made of a heat-conductive material, and said cooling fan is a cooling module comprising a heat receiving section having a heating component and extending to an outside of said fan housing, and a heat radiating fin extending to the air outlet side.

* * * * *